United States Patent [19]

Frisch

[11] Patent Number: 4,625,139

[45] Date of Patent: Nov. 25, 1986

[54] ELECTRO-PNEUMATIC SIGNAL CONVERTER

[75] Inventor: Herbert Frisch, Vienna, Austria

[73] Assignee: Enfo Grundlagenforschungs AG, Dottingen, Switzerland

[21] Appl. No.: 826,589

[22] Filed: Feb. 6, 1986

[30] Foreign Application Priority Data

Feb. 8, 1985 [AT] Austria .................................. 371/85

[51] Int. Cl.[4] .............................................. H01L 41/08

[52] U.S. Cl. ..................................... 310/330; 310/332

[58] Field of Search ................................ 310/330–332, 310/328, 323; 251/129, 285, 11, 291; 137/831, 837, DIG. 2; 116/DIG. 7

[56] References Cited

U.S. PATENT DOCUMENTS

| | | | |
|---|---|---|---|
| 3,519,009 | 7/1970 | Rubin | 310/332 |
| 3,965,376 | 6/1976 | Arndt et al. | 310/328 X |
| 4,450,375 | 5/1984 | Siegal | 310/332 X |
| 4,492,360 | 1/1985 | Lee et al. | 310/330 X |
| 4,545,561 | 10/1985 | Brown | 310/330 X |
| 4,567,394 | 1/1986 | Frisch | 310/328 X |

FOREIGN PATENT DOCUMENTS 3400645 7/1984 Fed. Rep. of Germany .

*Primary Examiner*—Mark O. Budd
*Attorney, Agent, or Firm*—Watson, Cole, Grindle & Watson

[57] ABSTRACT

An electro-pneumatic signal converter is provided with a piezo-electric bending element (3) disposed in a sealed transmitter casing (1) from which a signal output (4) issues. It controls a pneumatic signal transmitter which consists of an air inlet seating (5) and an air outlet seating (6) provided opposite each other in the transmitter casing (1). The piezo-electric bending element (3) is pretensioned against the air inlet seating (5) by a spring. In order to improve its retention and guiding, the piezo-electric bending element (3) is disposed in a chamber (2) which closely surrounds it in the transmitter casing (1), in which support zones (14, 16) spaced-apart in the axial direction are provided for the bending element (3), and in addition the piezo-electric bending element (3) is retained and urged against the support zones (14, 16) by a guide spring (7) fixed in the transmitter casing (1).

12 Claims, 6 Drawing Figures

ELECTRO-PNEUMATIC SIGNAL CONVERTER

BACKGROUND OF THE INVENTION

The invention relates to an electro-pneumatic signal converter, having a piezo-electric bending element which is disposed in a sealed transmitter casing from which a signal output issues, and which when an electrical voltage is applied bends to thus control a pneumatic signal transmitter which consists of an air inlet seating and an air outlet seating provided opposite each other in the transmitter casing, the piezo-electric bending element being pretensioned against the air inlet seating by a spring.

A signal converter of this construction is known from DE-OS No. 3400645. In this, the piezo-electric bending element is clamped along an edge region in the transmitter casing and is elastically urged against the air inlet seating. As soon as an electrical voltage is applied to the piezo-electric bending element, this latter lifts away from the air inlet seating and closes the air outlet seating. The signal output, which was previously vented through the air outlet seating, is connected by this means to the air inlet seating, so that the pressure medium fed through the air inlet seating emerges at the signal output as a pneumatic pressure signal. As soon as the voltage at the piezo-electric bending element is switched off or reversed in polarity, the bending element returns to its initial position, so that the signal output is again vented. This electro-pneumatic signal converter is characterised by a small energy requirement. It operates without significant energy comsumption, so that it is able to advantageously replace the conventional solenoid valves for the electrical operation of pneumatic circuits and apparatus, e.g. for the servo control of valves.

The object of the invention is to improve this signal converter, and in particular to simplify its manufacture, to provide more accurate guiding of the piezo-electric bending element during its control movement, and to reduce the response time of the pneumatic part.

This object is attained according to the invention in that the piezo-electric bending element is disposed in a chamber which closely surrounds it in the transmitter casing, support zones spaced-apart in the axial direction of the bending element being provided for this latter, and in that the piezo-electric bending element is retained and urged against the support zones by a guide spring fixed in the transmitter casing. By virtue of the substantial reduction in the volume of the chamber in the sealed transmitter casing, short response times are also attained for small pneumatic throughputs through the signal converter, so that for example in the servo control of pneumatic valves, short valve switching times can be attained. The narrow chamber in which the mobile bending element is disposed requires the bending element to be precisely fixed and guided, and this is attained by the arrangement of support zones according to the invention, and in particular by the guide spring provided by the invention. Overall, by this means a precise guiding of the piezo-electric bending element is attained, making advantageous operation of the signal converter possible. Moreover, in spite of its constructional and operational accuracy, the arrangement according to the invention is characterised by a surprising simplicity.

In a preferred embodiment of the invention, the piezo-electric bending element is supported on the transmitter casing on a support bearing and, axially spaced apart therefrom, on a rocking fulcrum consisting of punctiform or linear rocker bearings disposed on both sides of the longitudinal axis of the piezo-electric bending element. In this case the support zones are disposed on the transmitter casing itself, and therefore exactly defined in terms of their spatial position. The support bearing can be in the form of an electrical contact pin which is inserted into the transmitter casing and simultaneously serves for feeding the voltage.

According to an advantageous embodiment of the invention, the guide spring which urges the piezo-electric bending element against the support zones can act on the piezo-electric bending element in a region lying in an axial direction between the support bearing and the rocking fulcrum by way of at least one preferably punctiform or linear contact zone, e.g. by way of a spherical bead. By this means a defined point of action of the spring force is attained. Preferably, the contact zone or contact zones of the guide spring are provided on an axially extending tongue thereof, which is separated from the edge regions by cut-out portions. This construction prevents the point of action of the spring force becoming displaced should the guide spring become distorted. For fixing the guide spring in the transmitter casing, the guide spring can be provided with fixing lugs projecting laterally beyond the piezo-electric bending element, and to which pins retained in the transmitter casing are fixed, the pins preferably being in the form of contact pins which simultaneously serve for the voltage feed. By means of this construction, the guide spring is only clamped between two casing halves, the pins providing exact centering. Feeding the electrical voltage to the piezo-electric bending element advantageously by way of the guide spring results in simple construction, if the pins provided for centering also act as contact pins.

In the signal converter according to the invention, in addition to fixing the guide spring in the casing it is also necessary to make a firm connection between the guide spring and the piezo-electric bending element. For this purpose the guide spring can comprise retention lugs which laterally project beyond the piezo-electric bending element, to be bent around the edges of the piezo-electric bending element and be fixed to this latter, preferably by firm cementing.

As only a limited space is available in the transmitter casing for the guide spring, this latter is advantageously in the form of a flat cantilever spring. It can be bent upwards against the support zones and thus provide the required spring force. According to a further embodiment of the invention, the guide spring comprises a tongue which is bent away from the piezo-electric bending element out of the plane of the guide spring and has its end bent towards the bending element so that the end of the tongue lies against the piezo-electric bending element. The end of the tongue bent in this manner can be bevelled, so that the edge which lies against the piezo-electric bending element forms an exactly defined zone of action of the spring force.

In the signal converter according to the invention, the transmitter casing must obviously be so constructed that it sufficiently accurately and, in relation to the air inlet seating and air outlet seating, sufficiently rigidly supports the guide spring which retains and guides the piezo-electric bending element. In order to attain this, the transmitter casing consists of solid plates of a rigid material, in which flat recesses are provided for the piezo-electric bending element and its guide spring. The recesses in the plates of the transmitter casing closely surround the piezo-electric bending element and the associated guide spring, leaving free only the space necessary for the movement and that resulting from the overdimensioning required by manufacturing tolerances. This construction ensures the required small inherent volume of the signal converter, without the movements of the piezo-electric bending element and its guide spring being hindered by distortion or suchlike of the casing parts.

In order to simplify the voltage feed to the piezo-electric bending element, the transmitter casing can consist of an electrically insulating material, preferably ceramic or glass. Both materials are sufficiently firm to ensure the required flexural stiffness and resistance to distortion. The plates forming the transmitter casing lie on each other in an air-tight manner about the recesses, and are preferably cemented together.

Further details and advantages of the invention will be apparent from the description of embodiments given hereinafter with reference to the drawings.

In these,

Figure 1:
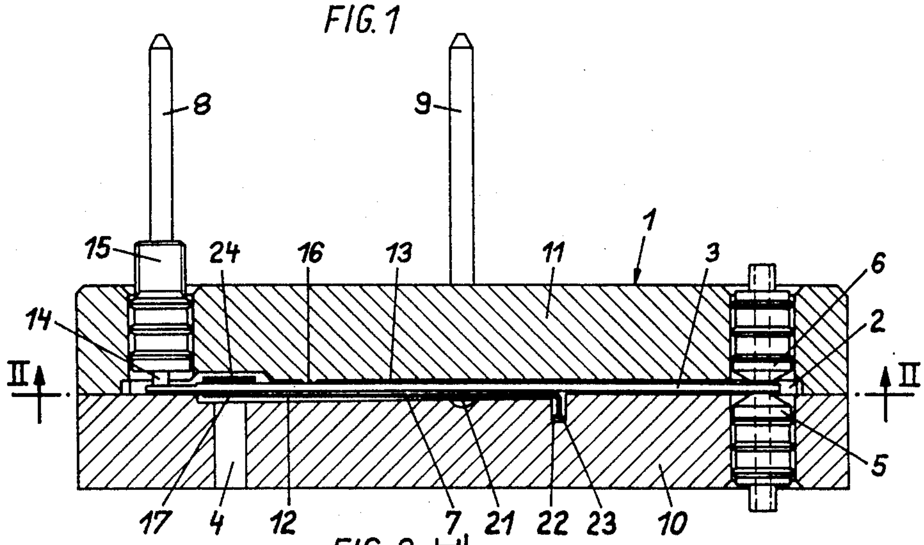
FIG. 1 is an axial section through a signal converter according to the invention on the line I—I of FIG. 2.
Figure 2:
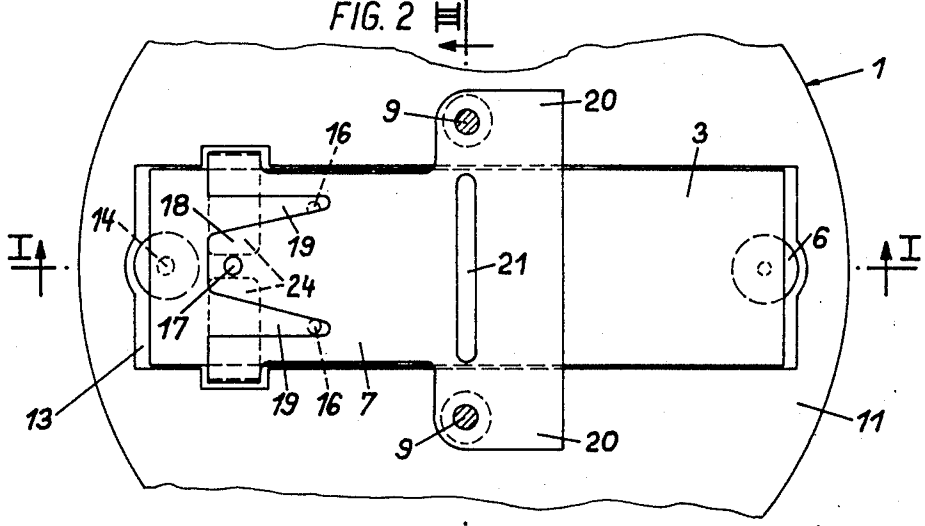
FIG. 2 is a cross-section thereof on the line II—II of FIG. 1.
Figure 3:
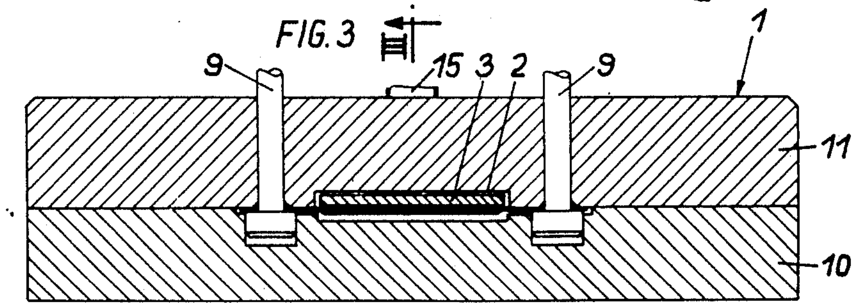
FIG. 3 is an axial section on the line III—III of FIG. 2.

The electro-pneumatic signal converter shown in FIGS. 1 to 3 consists of a transmitter casing 1, forming a sealed chamber 2 in which a piezo-electric bending element 3 is disposed. A signal output 4 issues from the chamber 2. In addition, an air inlet seating 5 and an air outlet seating 6 are inserted in mutually aligned bores in the casing 1. A piezo-electric bending element 3 is retained and guided in the chamber 2 by a guide spring 7, and controls the air inlet seating 5 and air outlet seating 6. Contact pins 8 and 9 are inserted into the casing 1 for feeding the electrical voltage to the piezo-electric bending element 3.

The transmitter casing 1 consists of two solid plates 10 and 11 of rigid, preferably electrically insulating material, e.g. ceramic or glass. The chamber 2 is formed from flat recesses 12 and 13 in the plates 10 and 11. As can be seen in particular in FIGS. 1 and 3, the recesses 12, 13 in the plates 10, 11 closely surround the piezo-electric bending element 3 and the associated guide spring 7, so that only the space necessary for the movement and that which results from the overdimensioning determined by manufacturing tolerances remains. The two plates 10, 11 lie in an air-tight manner on each other about the recesses 12, 13, and are preferably cemented together.

Figure 4:
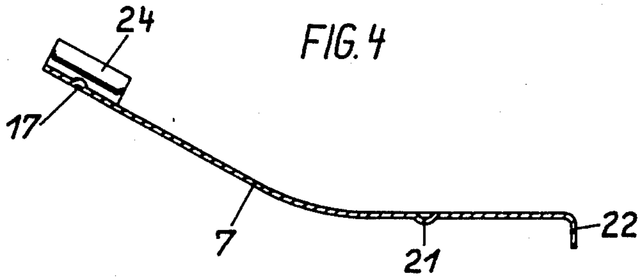
FIG. 4 is a longitudinal section through the spring used in the embodiment of FIGS. 1 to 3, and FIGS. 5 and 6 show a plan view and longitudinal section of a further embodiment of the guide spring.

The piezo-electric bending element 3 is supported in the chamber 2 on two zones spaced apart in the axial direction of the bending element 3. One of the support zones consists of a support bearing 14 which in the embodiment is formed by the lower end of the contact pin 8. This is inserted in a bore in the plate 11 of the transmitter casing 1 by way of a bush 15 which advantageously consists of electrically insulating material. In contrast, the other support zone is in the form of a rocking fulcrum and consists of two rocker bearings 16, which project burl-shaped from the plate 11 and into the chamber 2. In FIG. 2, the two rocker bearings 16 are shown by dashed lines. The purpose of the guide spring 7, shown in plan view in FIG. 2 and in longitudinal section in FIG. 4, is to urge the piezo-electric bending element 3 against the two support zones 14 and 16. It acts by way of a punctiform contact zone 17, formed from a spherical bead, against the piezo-electric bending element 3 in a region lying in an axial direction between the support bearing 14 and the rocker bearing 16. From FIG. 2 it can be seen that the contact zone 17 is provided on a tongue 18, which is formed by means of lateral cut-out portions 19. The guide spring 7 is fixed to the transmitter casing 1 by means of lugs 20, which project laterally beyond the piezo-electric bending element 3 and are firmly clamped between the two plates 10 and 11 of the transmitter casing 1. Contact pins 9 fixed in the transmitter casing 1 engage in bores in the lugs 20 for centering purposes. By this means, the voltage feed to the piezo-electric bending element 3 takes place by way of the contacting spring 7. A corrugation 21 extending transversely to the guide spring 7 between the lugs 20 provides stiffening. The bent-over edge 22 of the guide spring 7, which projects into a groove 23 in the plate 10 of the casing 1, serves for the same purpose and also for additional centering. In the region of the tongue 18 the guide spring 7 comprises likewise laterally projecting retention lugs 24, which are bent over about the piezo-electric bending element 3 to retain this latter firmly. In this manner, the piezo-electric bending element 3 is securely retained and accurately guided in the transmitter casing 1 by means of the guide spring 7.

Figure 5:
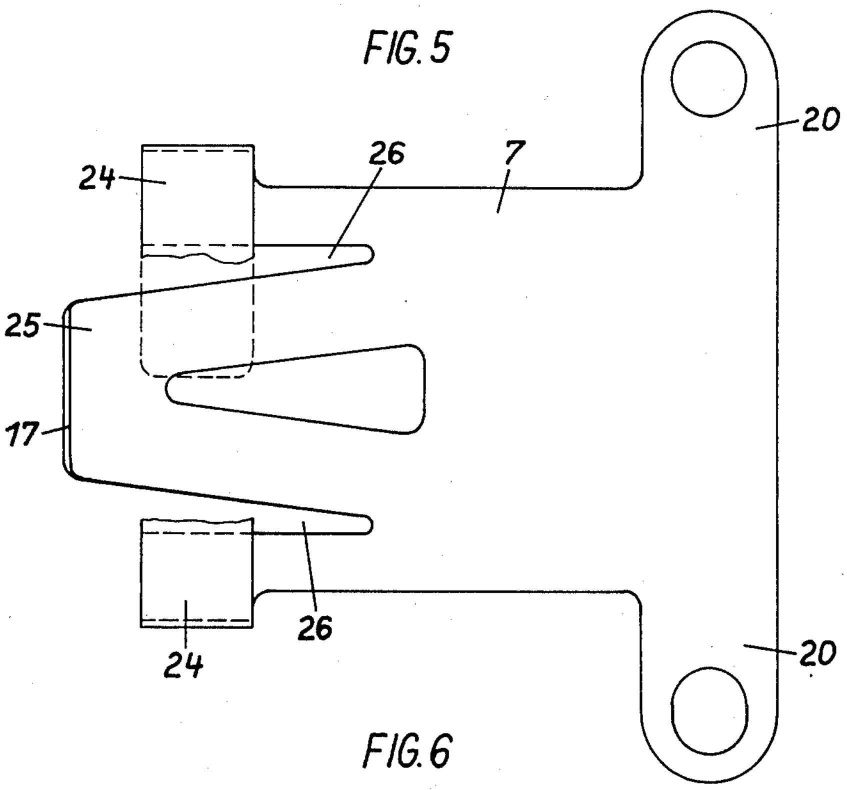
Figure 6:
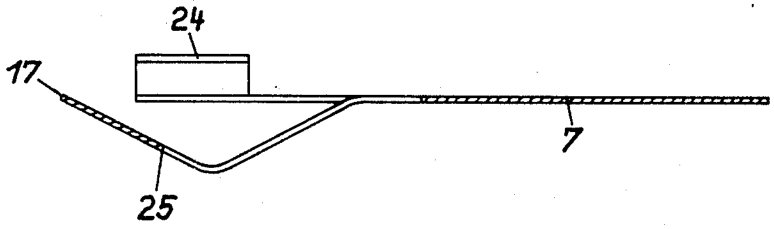

The guide spring 7 shown in FIG. 4 is bent upwards in the direction of the retention lugs 24 which fix the piezo-electric bending element, not shown, to thus produce the spring force. The guide spring 7 shown in FIGS. 5 and 6 differs from this embodiment in that it comprises a tongue 25 which is firstly bent downwards away from the retention lugs 24 and out of the plane of the guide spring 7, and is then bent upwards at its end. The end of the tongue 25 thus forms a linear contact zone 14 by which the guide spring 7 lies against the piezo-electric bending element 3. Again in this embodiment, laterally projecting fixing lugs 20 are provided for fixing the guide spring 7 in the transmitter casing 1, and retention lugs 24 for securing the piezo-electric element 3. The tongue 25 is separated from the edges of the guide spring 7 by lateral cut-out portions 26.

From the drawings it can be seen that the piezo-electric bending element 3 is securely fixed and accurately guided in the transmitter casing 1 by the guide spring 7. It urges the piezo-electric bending element 3 against the two support zones, namely the support bearing 14 and rocker bearing 16, which are mutually orientated in such a manner that the end of the piezo-electric bending element 3 presses against the air inlet seating 5 and tightly closes it. In this position, shown in FIG. 1, the signal output 4 is connected to the air outlet seating 6 by way of the chamber 2 and thus becomes depressurised. When an electrical voltage is fed through the contact pins 8 and 9, the piezo-electric bending element bends so that it lifts away from the air inlet seating 5 to close the air outlet seating 6. The pressure medium fed through the air inlet seating 5 can then reach the chamber 2 and from here reach the signal output 4, by which the fed electrical signal is converted into a pneumatic pressure signal. As soon as the voltage feed ceases, the piezo-electric bending element 3 returns to its initial position, so that the signal output 4 again becomes depressurised.

The recesses 12, 13 in the plates 10, 11 of the transmitter casing 1 very closely surround the piezo-electric bending element 3 and the associated guide spring 7, so that only the space required for the movement and that deriving from the overdimensioning determined by manufacturing tolerances remains. The chamber 2 therefore has a small volume. Only small quantities of pneumatic pressure medium are required to fill it, so that short valve switching times can be attained. The three-point support for the piezo-electric bending element 3 on the plate 11 of the transmitter casing, namely at the support bearing 14 and at the two rocker bearings 16, allows precise setting of the position of the bending element 3 between the air inlet seating 5 and air outlet seating 6. This setting can be done by axially adjusting the air inlet seating 5 and air outlet seating 6, and if necessary also the bush 15 of the contact pin 8, the lower end of which forms the upport bearing 14. In spite of the small deflection of the piezo-electric ending element 3, it allows precise control of the signal converter.

What is claimed is:

1. An electro-pneumatic signal converter, comprising a piezo-electric bending element disposed in a sealed transmitter casing from which a signal output issues, and which when an electrical voltage is applied bends to thus control a pneumatic signal transmitter including an air inlet seating and an air outlet seating provided opposite each other in the transmitter casing, the piezo-electric bending element being pretensioned against the air inlet seating by a spring, said piezo-electric bending element being disposed in a chamber which closely surrounds it in the transmitter casing, support zones spaced apart in the axial direction of the bending element being provided for this latter, and said piezo-electric bending element being retained and urged against the support zones by a guide spring fixed in the transmitter casing.

2. A signal converter as claimed in claim 1, wherein said piezo-electric bending element is supported on the transmitter casing by a support bearing and, axially spaced apart therefrom, on a rocking fulcrum including linear rocker bearings disposed on both sides of the longitudinal axis of the piezo-electric bending element.

3. A signal converter as claimed in claim 2, wherein said support bearing is in the form of an electrical contact pin inserted into the transmitter casing.

4. A signal converter as claimed in claim 1, 2 or 3, wherein said guide spring acts on the piezo-electric bending element in a region lying between the support bearing and the rocker bearing by way of at least one linear contact zone.

5. A signal converter as claimed in claim 4, wherein said contact zone of the guide spring is provided on an axially extending tongue thereof, which is separated from the edge regions by cut-out portions.

6. A signal converter as claimed in any one of claims 1, 2 or 3, wherein said guide spring comprises fixing lugs projecting laterally beyond the piezo-electric bending element and to which pins retained in the transmitter casing are fixed, said pins being in the form of contact pins which simultaneously serve for the voltage feed.

7. A signal converter as claimed in any one of claims 1, 2 or 3, wherein said guide spring comprises retention lugs which project laterally beyond the piezo-electric bending element to be bend around the edges of the piezo-electric bending element and be fixed thereto by firm cementing.

8. A signal converter as claimed in any one of claims 1, 2 or 3, wherein said guide spring comprises a tongue which is bent away from the piezo-electric bending element out of the plane of the guide spring and has its end bent towards the bending element so that the end of the tongue, forming the contact zone, lies against the piezo-electric bending element.

9. A signal converter as claimed in any one of claims 1, 2 or 3, wherein said transmitter casing includes solid plates of a rigid materal, in which flat recesses are provided for the piezo-electric bending element and the guide spring.

10. A signal converter as claimed in claim 9, wherein said recesses in the plates of the transmitter casing closely surround the piezo-electric bending element and the associated guide spring, leaving free only the space necessary for movement of said bending element.

11. A signal converter as claimed in claim 9, wherein said transmitter casing consists of an electrically insulting material.

12. A signal converter as claimed in claim 10, wherein said plates forming the transmitter casing lie on each other in an air-tight manner about the recesses and are cemented together.

* * * * *